United States Patent [19]

Makimoto et al.

[11] Patent Number: 4,749,963

[45] Date of Patent: Jun. 7, 1988

[54] OSCILLATOR HAVING STRIPLINE LOOP RESONATOR

[75] Inventors: Mitsuo Makimoto, Yokohama; Isao Ishigaki, Sagamihara; Morikazu Sagawa, Hachioji; Motoi Ohba, Yokohama, all of Japan

[73] Assignee: Matsushita Electric Industrial Co., Ltd., Osaka, Japan

[21] Appl. No.: 940,114

[22] Filed: Dec. 9, 1986

[30] Foreign Application Priority Data

Dec. 11, 1985 [JP] Japan ................... 60-278215
Jan. 31, 1986 [JP] Japan ................... 61-20801
Feb. 6, 1986 [JP] Japan ................... 61-24352
Oct. 17, 1986 [JP] Japan ................... 61-247763

[51] Int. Cl.$^4$ ............................................. H03B 5/18
[52] U.S. Cl. ................... 331/99; 331/117 D; 333/220; 333/246
[58] Field of Search ............... 331/99, 107 SL, 117 D; 333/219, 221, 238, 246, 247, 128, 220

[56] References Cited

U.S. PATENT DOCUMENTS

| 4,121,182 | 10/1978 | Makimoto et al. | 333/205 |
| 4,129,842 | 12/1978 | Torii et al. | 331/117 D X |
| 4,185,252 | 1/1980 | Gerlach | 331/99 X |
| 4,453,269 | 6/1984 | Skar | 331/117 D X |

FOREIGN PATENT DOCUMENTS 42574 12/1979 Japan .

Primary Examiner—Siegfried H. Grimm
Attorney, Agent, or Firm—Spencer & Frank

[57] ABSTRACT

A high frequency oscillator comprising a ring type inductive resonator of a microstrip line constituted in a rectangular or annular loop. Capacitors are serially connected to both ends of the line, thereby improving the low-noise, separation and stability characteristics by use of the steep-phase characteristic of the ring-shaped resonator.

5 Claims, 7 Drawing Sheets

OSCILLATOR HAVING STRIPLINE LOOP RESONATOR

BACKGROUND OF THE INVENTION

The present invention relates to a high frequency oscillator which is used in various communication equipments, measuring instruments, and the like.

A Colpitts oscillator is often used as a high frequency oscillator. A microstrip line resonator is used as an inductive element because of its low-loss characteristic.

The microstrip line resonator is also frequently used in a voltage controlled oscillator and the like. For example, a capacitor is connected to an open end of the microstrip resonance line, a DC circuit consisting of a DC blocking capacitor and a variable capacitance diode is connected to the other end, and a control signal of the oscillating frequency is applied to the central connection point of the DC blocking capacitor and variable capacitance diode. The voltage controlled oscillator of such a constitution is frequently used as a voltage controlled oscillator (VCO) of a local oscillator, a frequency synthesizer, or the like of a UHF tuner. However, such a VCO has drawbacks such that the unloaded Q of the resonator is not high, spatial separation between the resonator and the other circuits is bad, stray coupling occurs, the stability of the oscillator is low, and the like.

As a resonator having a high Q and using a strip line, a ring resonator is disclosed in and known from Japanese Patent Examined Publication No. 42574/1979 which corresponds to U.S. Pat. No. 4,121,182 granted Oct. 17th, 1978 to Makimoto et al. Although the resonator is used as, e.g., an element of a filter, it is not used as a resonance element of an oscillator.

SUMMARY OF THE INVENTION

It is an object of the present invention to provide a high frequency oscillator which generates less noise than a conventional oscillator using a strip line resonator, which is improved in spatial separation between the resonator and other circuits such as buffer amplifiers and the like, and which has improved oscillation stability.

According to the invention, a resonator of a ring structure in which a microstrip line is constituted in a rectangular or annular loop and capacitors are serially connected to both ends thereof is used as an inductive element, thereby improving the low-noise, separation characteristic, and stability by use of the steep phase characteristic of the ring-shaped resonator.

DESCRIPTION OF THE PREFERRED EMBODIMENTS

An embodiment of the present invention will be described in detail hereinbelow with reference to the drawings.

Figure 1:
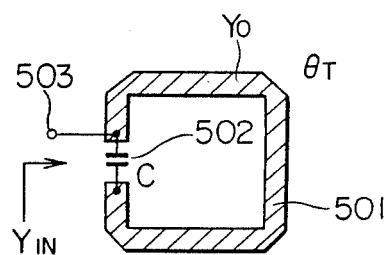
FIG. 1 is a plan view showing an example of a ring-shaped resonator for use in the present invention.

FIG. 1 shows a plan view of a practical resonator of a ring or loop-shaped structure which is used in the invention. In the diagram, reference numeral 501 denotes a microstrip line, 502 is a capacitor, and 503 is an input terminal. Assuming that the characteristic admittance of the microstrip line 501 is $Y_0$, the electric length of the line is $\theta_T$, and the capacitance value of the capacitor 502 is C, the input admittance $Y_{in}$ when it is measured at the input terminal 503 is given by the following expression.

$$Y_{in} = jY_0 \frac{Y_0 \sin \theta_T - 2\omega C (1 - \cos \theta_T)}{Y_0 \cos \theta_T - \omega C \sin \theta_T}$$

Figure 2:
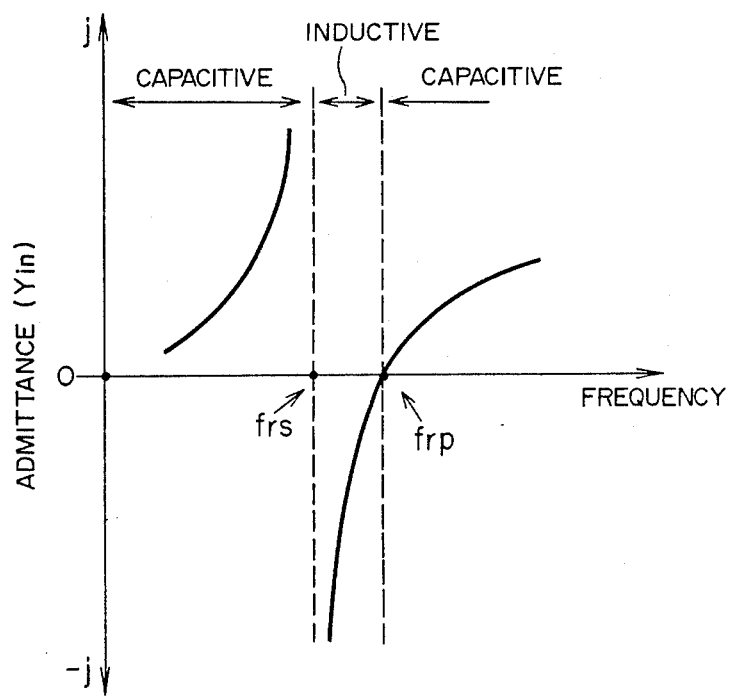
FIG. 2 is a characteristic diagram of the ring-shaped resonator of FIG. 1.

The frequency characteristic of the input admittance $Y_{in}$ is as shown in FIG. 2. Since $Y_{in}=0$ equivalently indicates the formation of the parallel resonance circuit and $Y_{in}=\pm\infty$ equivalently indicates the formation of the series resonance circuit, the ring resonator loaded with the capacitor denotes that the parallel resonance point ($f_{rp}$) exists near the series resonance point ($f_{rs}$). In addition, since the resonance element of the oscillator is used within the inductive region, the oscillating condition is satisfied between the series and parallel resonance points $f_{rs}$ and $f_{rp}$ of the oscillator. On the contrary, the phase change between $f_{rs}$ and $f_{rp}$ is much steeper than that of the ordinary resonator, namely, the value of $d\phi/d\omega$ ($\phi$: phase, $\omega$: angular frequency) is large; therefore, the resonator can be used as a resonator having a good oscillation spectrum.

As will be apparent from FIG. 1, the resonator of the foregoing constitution doesn't have a high-frequency grounding (short-circuit) point, so that no loss occurs at a grounding point and the resonator can be formed into a rectangular shape. Therefore, an input circuit can be provided on one side, an output circuit can be provided on the other opposite side and the circuits can be spatially separated, so that the function to reduce the stray coupling can be achieved.

Practical embodiments of the invention will be explained hereinbelow.

Figure 3:
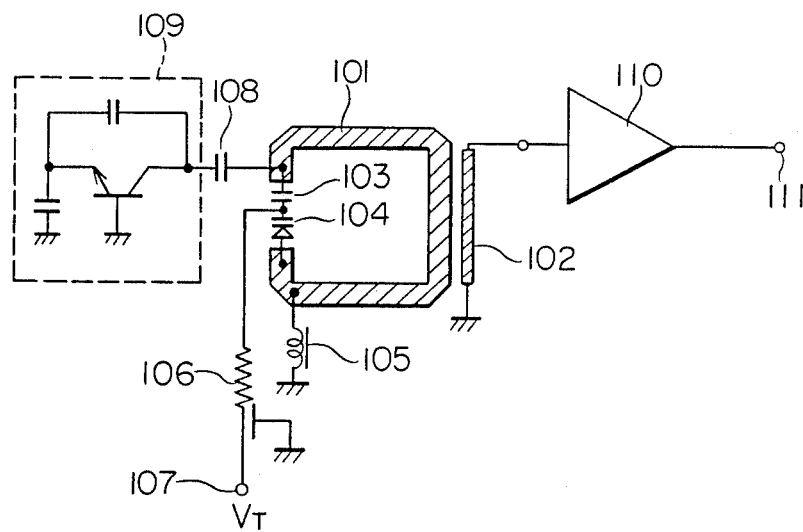
FIGS. 3 to 5 are plan views showing the main sections of high frequency oscillators in the first, second, and third embodiments of the invention, respectively.
Figure 5:
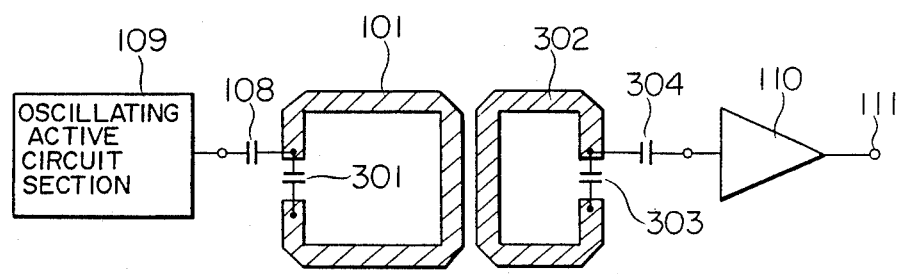

FIG. 3 is a circuit diagram of an oscillator in accordance with the first embodiment of the invention. In FIG. 3, reference numeral 101 denotes a ring-shaped resonator formed by a rectangular loop-shaped strip line as shown in FIG. 1; 102 is an output coupling line; 103 a DC blocking capacitor; 104 a variable capcitance diode; 105 an RF choke; 106 a bias resistor; 107 a frequency control terminal; 108 a coupling capacitor; and 109 an active circuit section of the oscillator including a transistor. The oscillating circuit consists of a resonance circuit section and the active circuit section 109. The circuit of FIG. 1 is fundamentally used as the resonance circuit section. As shown in FIG. 5, an output circuit is arranged so as to face the active circuit section 109 through the resonance circuit. Therefore, an output buffer amplifier 110 and the oscillating active circuit section 109 are spatially separated and there are advantages such that the stray coupling is reduced, spurious oscillation of the oscillating circuit is decreased, and influences of load fluctuation are reduced.

Figure 4:
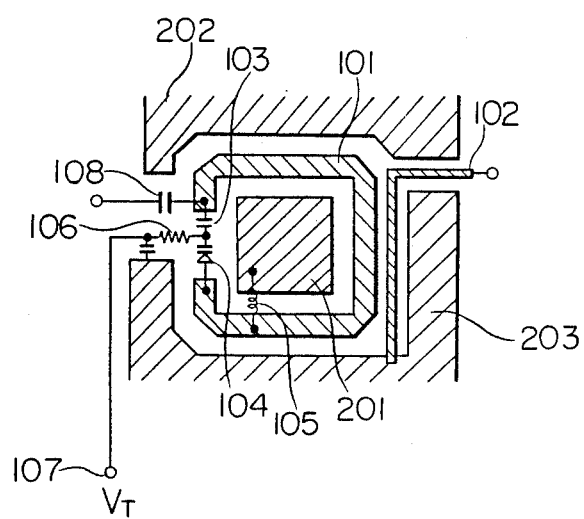

FIG. 4 shows a second embodiment of the invention intended to further improve the spatial separation of the oscillator of FIG. 3. FIG. 4 differs from the constitution of FIG. 3 in that grounding conductors 201, 202 and 203, having peripheral edges, are respectively provided.

By providing the grounding conductors 201 to 203 for both inside and outside of the ring-shaped resonator as shown in FIG. 4, the resonator 101 has a co-planar line structure. Thus, the extent of the electromagnetic field is small and the effect of the spatial separation is further improved as compared with FIG. 1.

FIG. 5 shows a third embodiment of the invention and relates to an example of a fixed oscillating circuit. In FIG. 5, the resonator 101 of two ring-shaped resonators is used as an oscillator and the other resonator 302 is used as a filter.

Namely, in FIG. 5, numerals 101 and 302 denote the ring-shaped resonators formed by the ring-shaped strip lines; 301 and 303 are resonance capacitors; 108 and 304 are coupling capacitors; 109 is an oscillating active circuit section; 110 is an output buffer amplifier; and 111 is an output terminal.

According to this embodiment, the oscillation is performed by the resonator 101 and its output is filtered by the resonator 302 and there is an effect that the purity of the output spectrum is remarkably improved. Since the RF is not grounded, this embodiment is suitable for patterning and has an advantage in that it can be also applied to MIC (microwave integrated circuit) or MMIC (monolithic microwave integrated circuit).

As described above, since the steep phase-change characteristic of the ring-shaped resonator is utilized, the sharpness of the oscillation spectrum is extremely good and the active circuit section and output buffer amplifier section can be spatially separated. Thus, the stray coupling is reduced and the stability can be improved. Further, since the oscillation output can be filtered as necessary, a low-noise oscillating circuit can be constituted. The RF is not grounded and the patterning and realization of an IC can be easily accomplished. The industrial value is fairly large.

Figure 6:
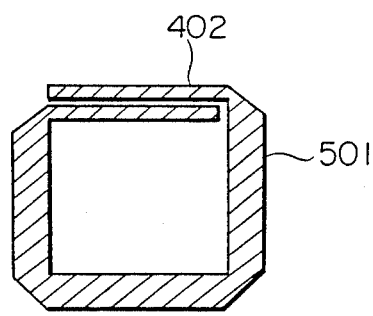
FIG. 6 is a plan view showing another embodiment of a microstrip line resonator for use in the invention.

FIG. 6 shows another embodiment of a strip line resonator for use in the invention.

In FIG. 6, reference numeral 501 denotes a single strip line portion and 402 is a parallel-coupled strip line portion. These line portions are patterned on a dielectric substrate made of alumina or the like. It can be considered that the strip line portion 402 parallel coupled by distributive capacitance coupling was substituted for the capacitive element 502 in FIG. 1. When the resonance frequency is high, the resonator can be designed such that the coupling length is small and the coupling interval is wide, so that the frequency variation decreases. In addition, the loss which is caused in the coupled strip portion 402 is extremely small as compared with the case of the discrete capacitor. In an actual design, if the resonator is designed so as to obtain the relation of $Z_0^2 \approx Z_{0e} \cdot Z_{0o}$ when it is assumed that the odd-mode impedance and the even-mode impedance of the parallel coupled strip line portion 402 are $Z_{0o}$ and $Z_{0e}$ and the line impedance of the single strip line portion 501 is $Z_0$, the reflection in the connected portion of the line portions 402 and 501 is reduced, so that the characteristics of the resonator are stabilized.

According to this embodiment, by replacing the discrete capacitive element of the ring-shaped resonator in FIG. 1 with the parallel coupled line, resonance frequency variations can be reduced and the loss can be also decreased. Therefore, in the case of applying this resonator to the filter or the like, adjustment free and low loss characteristics can be realized and the industrial value is extremely large.

Figure 7A:
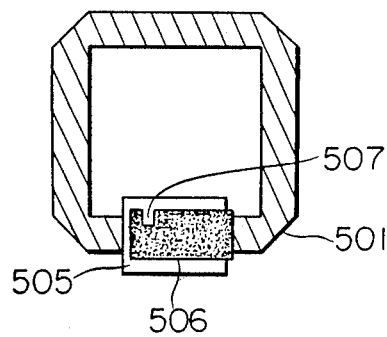
FIGS. 7(a), 7(b), 8(a), 8(b), 9(a), and 9(b) are plan views and cross sectional side views showing still other embodiments of a microstrip line resonator for use in the invention.
Figure 7B:
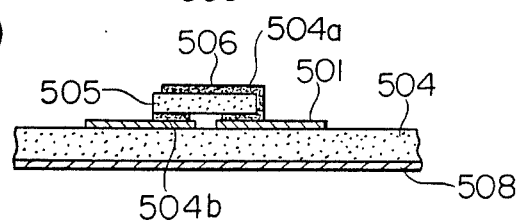

FIGS. 7(a) and 7(b) are a plan view and a side elevational view of still another embodiment of a strip line resonator for use in the invention.

In FIGS. 7(a) and 7(b), reference numeral 501 denotes the strip line; 504 is a dielectric substrate; 505 a parallel flat plate formed of ceramics or the like; 506 and electrode to form the capacitor; 507 a trimming portion of the electrode 506; and 508 a grounding conductor of the dielectric substrate 504.

As shown in FIG. 7(b), two electrodes 504a and 504b are formed on surfaces of the parallel flat plate 505.

More specifically, electrode 504a is affixed to almost the entire upper surface, the side surface and a portion of the lower surface of the parallel flat plate 505, the portion of the electrode 504a on the lower surface of plate 505 contacting an open end of the strip line 501. Electrode 504b is affixed to the lower surface of plate 505 spaced from electrode 504a and contacting the other open end of strip line 501. The parallel flat plate capacitor is formed by the upper and lower surfaces of the plate 505. This capacitor is connected so as to serially connect two open ends of the strip line 501, thereby forming a ring-shaped resonator. By trimming the electrode 504a by a laser beam or a sandblast, the resonance frequency is adjusted.

Figure 8A:
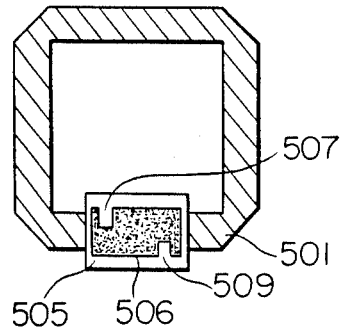
Figure 8B:
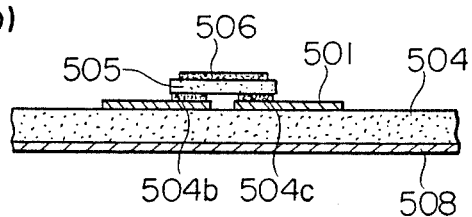

FIGS. 8(a) and 8(b) show a plan view and a side elevation view of a strip line resonator of still another embodiment.

In FIGS. 8(a) and 8(b), the same parts and elements as those shown in FIGS. 7(a) and 7(b) are designated by the same reference numerals and have the same functions; therefore, their descriptions are omitted.

This embodiment differs from that of FIGS. 7(a) and 7(b) with respect to the structure of the capacitor which is formed by the parallel flat plate 505 and electrode 506 and to the point such that two capacitors of the electrodes 504b and 504c are connected in series. Therefore, as compared with the embodiment of FIGS. 7(a) and 7(b), two trimming portions 507 and 509 exist and the range within which the capacitance can be changed is enlarged. Since the voltage which can be withstood by the capacitor is increased, a large amount of electric power can be handled.

Figure 9A:
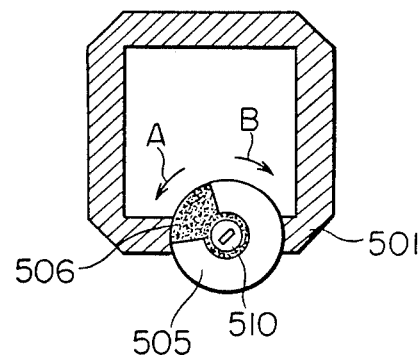
Figure 9B:
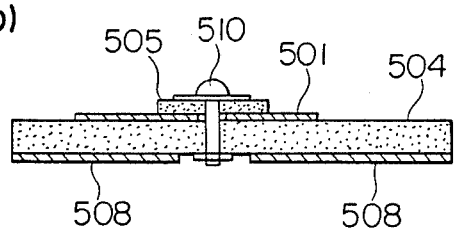

FIGS. 9(a) and 9(b) show a plan view and a side elevational view of a strip line resonator of a further embodiment of the invention.

In this embodiment, the parallel flat plate 505 is formed by a disk (circular plate) made of ceramics or the like and the disk 506 can be mechanically turned, thereby changing the capacitance.

In FIGS. 9(a) and 9(b), numeral 504 denotes the dielectric substrate provided with the electrode 506, and 510 is a fixed pin made of a metal for fixing the substrate 505 and electrode 506 to the substrate 504.

As shown in FIGS. 9(a) and 9(b), the electrode 506 is turned in the direction indicated by an arrow A or B and the capacitance in the overlap portion of the electrode 506 and strip line 501 is varied, thereby adjusting the resonance frequency. This embodiment is equivalent to such a constitution that a trimmer capacitor is integrally connected to one end of the resonance line.

The strip line resonator according to this embodiment can easily adjust the frequency. Therefore, in the case of applying this resonator to the oscillator or filter, the production yield is remarkably improved and its industrial value is fairly large.

Figure 10:
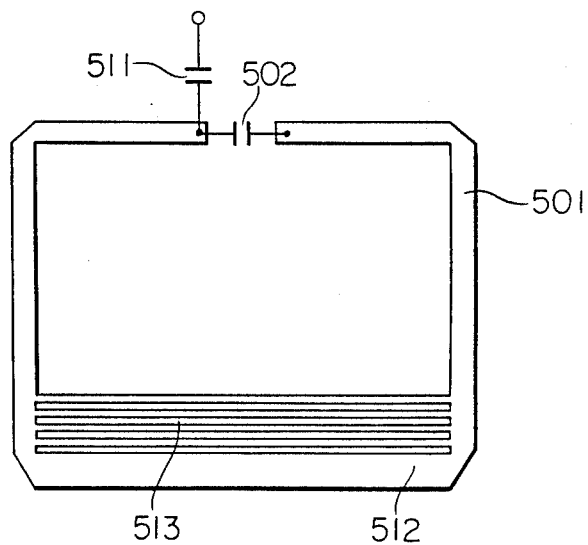
FIGS. 10 and 12 are plan views showing further embodiments of a microstrip line resonator for use in the invention, respectively.

FIG. 10 is a plan view of a ring-shaped microstrip line resonator comprising a further embodiment of the invention.

In FIG. 10, numeral 511 denotes a capacitor for coupling the input and output 502 is the resonating capacitor; 501 the microstrip line whose width is wide in a central portion 512; and 513 are slits for adjustment of the width which are formed in the wide central portion 512.

The function in the above constitution will now be described hereinbelow with reference to FIGS. 11(a) to 11(d).

Figure 11A:
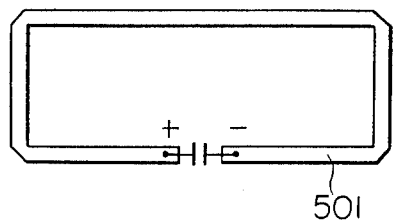
FIGS. 11(a) to 11(d) are equivalent circuit diagrams of the resonator of FIG. 10.
Figure 11B:
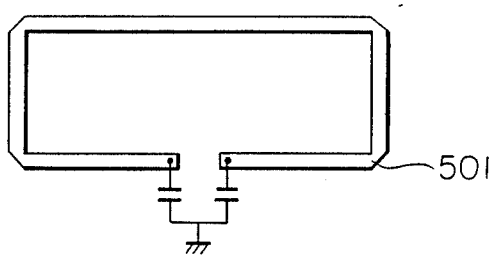
Figure 11C:
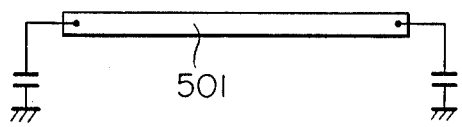

A ring-shaped microstrip line resonator shown in FIG. 11(a) can be equivalently developed in the resonance frequency range as shown in FIGS. 11(b) and 11(c). The circuit of FIG. 11(c) has generally the following impedance:

$$Z=(Z_l+jZ_0 \tan \beta l)/(Z_0 jZ_l \tan \beta l) \times Z_0$$

Figure 11D:
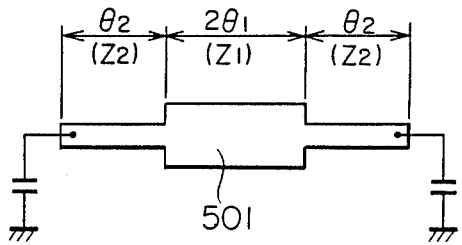

(wherein, $\beta$: phase constant, $Z_l$: split capacitance, l: microstrip line length, $Z_0$: characteristic impedance). When another split capacitance assumes $Z_i$, the resonance condition becomes $Z+Z_i=0$, so that $Z_i = j(Z_0 \tan \beta l - Z_l)/(1+Z_l \tan \beta l)$. From the above description, it is apparent that the resonance frequency is determined by the split capacitance and microstrip line length. The constitution of FIG. 10 can be similarly developed as shown in FIG. 11(d). In this case, the input impedance Z of the microstrip line 501 is expressed by the following expression.

$$Z = \{K(1 - \tan^2 \theta_1)(1 - \tan^2 \theta_2) - 2(1 + K^2) \cdot \tan \theta_1 \cdot \tan \theta_2\}/jY_2 \cdot 2(K \cdot \tan \theta_1 + \tan \theta_2)(K - \tan \theta_1 \cdot \tan \theta_2)$$

(wherein, $\theta_1$ and $\theta_2$ denote electric lengths of the central portion 512 and the side portion of the microstrip line 501, respectively; corresponding line impedances are $Z_1$ and $Z_2$; admittances are $Y_1$ and $Y_2$; and an impedance ratio $K=Z_2/Z_1=Y_1/Y_2$).

Namely, the impedance of the microstrip line 501 is determined by the line width. By changing the width of the microstrip line 501 shown in FIG. 10 by the slits 513, the resonance frequency can be adjusted.

Since the ring-shaped microstrip line resonator shown in FIG. 10 has a potential difference across the capacitor 502 to obtain resonance, a current short-circuiting mode occurs in the central portion 512 of the microstrip line 501. Therefore, by widening the width of this portion, the conductor resistance decreases and the reduction of Q can be prevented and in fact can be further improved. The adjustment of the line width can be realized by disconnecting or connecting width adjusting slits 513 shown in FIG. 10.

Figure 12:
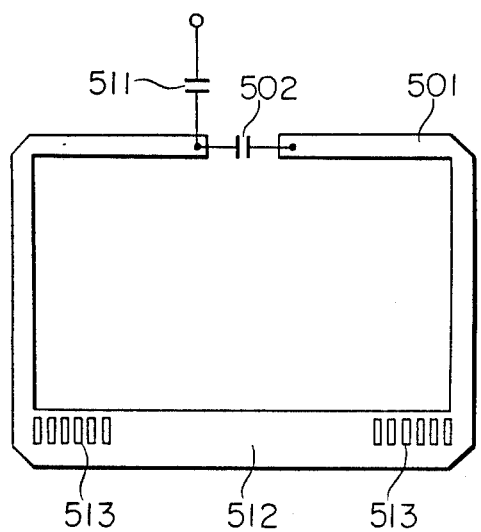

FIG. 12 is a plan view of a ring-shaped microstrip line resonator of still another embodiment of the invention.

The embodiment of FIG. 12 differs from the constitution of FIG. 10 in that microstrip line slits 513 to adjust the effective line length are formed in the length direction of the microstrip line 501.

In the above constitution, it will be apparent that when the line length changes, the impedanc Z of the microstrip line 501 also changes with the result of changing the resonance frequency similarly to the embodiment of FIG. 10. By use of this characteristic, the resonance frequency of the ring-shaped microstrip line resonator can be adjusted.

In the embodiment shown in FIG. 10, the width of slits 513 in the microstrip line 501 can be changed. In the embodiment of FIG. 12, the length of size of slits 513 along the microstrip line 501 can be changed. However, such width and length can be also simultaneously adjusted.

As mentioned, although the coupling capacitor 511 has been used for the input and output portions of the circuit, a coupled line or the like can be also used as the input/output coupling means. As described above, the resonance frequency can be easily changed and adjusted by varying the width of a part of the microstrip line and forming slits in that portion and changing the width or length of the line by changing them. The reduction of the unloaded Q of the circuit is prevented and there is a large advantage.

We claim:

1. A high frequency oscillator comprising
   a resonator including an ungrounded microstrip line in the shape of a substantially complete rectangular loop having spaced-apart ends and inner and outer sides, said microstrip line functioning as an inductive element of said resonator;
   capacitive means connected between the spaced-apart ends of said microstrip line;
   a first grounding conductor having a peripheral edge substantially surrounded by said loop-shaped microstrip line, the peripheral edge of said first grounding conductor extending adjacent to and substantially parallel to the inner side of said microstrip line; and
   a second grounding conductor having a peripheral edge located adjacent the outer side of said microstrip line and extending substantially parallel to the outer side of said microstrip line.

2. A high frequency oscillator comprising
   a first resonator including an ungrounded microstrip line in the shape of a substantially complete rectangular loop having spaced-apart ends, said first resonator functioning as the resonant element of said oscillator;
   a second resonator including an ungrounded microstrip line in the shape of a substantially complete rectangular loop having spaced-apart ends, a side of said first rectangular microstrip line being adjacent and parallel to a corresponding side of said second rectangular microstrip line and being coupled thereto, said second resonator functioning as the resonant element of a filter; and
   first and second capacitive elements coupled between the spaced-apart ends of said first and second microstrip lines respectively.

3. A high frequency oscillator comprising
   a resonator including an ungrounded microstrip line in the shape of a substantially complete rectangular loop having spaced-apart ends, said microstrip line functioning as an inductive element of said resonator;

first and second capacitive elements coupled in series between the spaced-apart ends of said microstrip line, said capacitive elements being formed by coupling the end portions of said microstrip line in parallel with each other, the odd-mode impedance $Z_{0o}$ and the even-mode impedance $Z_{0e}$ of said portion being related to the impedance $Z_0$ of the remainder of said microstrip line by the equation $Z_0^2 = Z_{0o} \cdot Z_{0e}$.

4. A high frequency oscillator comprising
a resonator including an ungrounded microstrip line in the shape of a substantially complete rectangular loop having spaced-apart ends, a portion of said line having a width which is wider than the rest of said line, said wider width portion of said line having at least one slit for changing the effective electrical length of said line thereby adjusting its resonant frequency; and capacitive means connected between the spaced-apart ends of said microstrip line.

5. A high frequency oscillator comprising a resonator in the form of an ungrounded microstrip line in the shape of a substantially complete rectangular loop having a portion including coupled spaced-apart parallel overlapping ends forming a distributed capacitance, said microstrip line functioning as an inductive element of said resonator, the odd-mode impedance $Z_{0o}$ and the even-mode impedance $Z_{0e}$ of said portion being related to the impedance $Z_0$ of the remainder of said microstrip line by the equation $Z_0^2 = Z_{0o} \cdot Z_{0e}$.

* * * * *